United States Patent [19]

Takada et al.

[11] Patent Number: 4,629,681
[45] Date of Patent: Dec. 16, 1986

[54] METHOD OF MANUFACTURING MULTILAYER CIRCUIT BOARD

[75] Inventors: Mitsuyuki Takada; Yoshiyuki Morihiro; Hayato Takasago, all of Amagasaki, Japan

[73] Assignee: Mitsubishi Denki Kabushiki Kaisha, Tokyo, Japan

[21] Appl. No.: 669,781

[22] Filed: Nov. 9, 1984

[30] Foreign Application Priority Data

Nov. 25, 1983 [JP] Japan ................. 58-222336

[51] Int. Cl.⁴ ............................. G03C 5/00; B05D 5/12
[52] U.S. Cl. ................................ 430/314; 430/315; 430/318; 430/319; 427/96; 427/103
[58] Field of Search ............... 430/315, 317, 319, 330, 430/314, 318, 313; 427/96, 98, 101, 103, 102

[56] References Cited

U.S. PATENT DOCUMENTS

| | | | |
|---|---|---|---|
| 4,211,603 | 7/1980 | Reed ................................ | 156/659.1 |
| 4,424,251 | 1/1984 | Sugishita et al. .................. | 428/209 |
| 4,464,420 | 8/1984 | Taguchi et al. ..................... | 427/96 |
| 4,487,811 | 12/1984 | Eichelberger et al. .............. | 428/546 |
| 4,508,749 | 4/1985 | Brannon et al. .................... | 427/43.1 |
| 4,547,455 | 10/1985 | Hiramoto et al. ................... | 430/325 |

Primary Examiner—John E. Kittle
Assistant Examiner—José G. Dees
Attorney, Agent, or Firm—Lowe Price Leblanc Becker & Shur

[57] ABSTRACT

A first conductor layer made of a thick film conductor is formed with a predetermined pattern on a substrate. A thick film resistor is then formed to be connected to the first conductor layer. An insulating layer made of a polyimide resin is formed over the substrate, the first conductor layer and the thick film resistor with through holes on the first conductor layer. Then, plating is applied to the whole surface of the insulating layer, the wall surfaces of the through holes and the exposed portions of the first conductor layer and etching is applied thereto with a predetermined pattern so that a second conductor layer is formed.

7 Claims, 4 Drawing Figures

METHOD OF MANUFACTURING MULTILAYER CIRCUIT BOARD

BACKGROUND OF THE INVENTION

1. Field of the Invention

The present invention relates to a method of manufacturing a multilayer circuit board and particularly to a method of manufacturing a circuit board of multiple thick film layers to be utilized in a hybrid integrated circuit.

2. Description of the Prior Art

Conventionally, for a multilayer circuit board to be utilized in an LSI package and the like, a high degree of integration, namely, formation of a fine connection pattern is required. A manufacturing method of such a multilayer circuit board is disclosed for example in Japanese Patent Laying Open No. 93296/1983.

In the latest technological trend, large scale integration is required for a hybrid integrated circuit and accordingly a high degree of integration and high reliability are needed in a multilayer circuit board to be utilized in such a hybrid integrated circuit. Such a recent trend concerning hybrid integrated circuits is shown for example in "Polyimide Dielectric on Hybrid Multilayer Circuits (by John Shurboff, Motorola Incorporated, in page 610 of IEEE, 1983)". In order to attain such large scale integration, it is necessary to apply a large number of signal lines in a multilayer circuit board utilized in a hybrid integrated circuit and to provide low resistance signal lines. Since a hybrid integrated circuit including the peripheral devices thereof needs to be functionally operated, it is necessary to obtain a high reliability and a high degree of integration by use of a thick film resistor of high reliability as well as by use of a conductor having good adhesion to a ceramic substrate.

FIG. 1 is a sectional view of a multilayer circuit board manufactured by a conventional manufacturing method. Referring to FIG. 1, a thick film as a first conductor layer 2 is formed on a substrate 1 of alumina ceramic for example, by printing and firing a conductor paste. A thick film resistor 3 is formed on the first conductor layer 2 and an insulating layer 4 of crossglass is formed on the thick film resistor 3. Then, by printing and firing a conductor paste, a thick film as a second conductor layer 5 is formed over the substrate 1, the first conductor layer 2 and the insulating layer 4.

Thus, thick films are formed as the respective layers in a conventional multilayer circuit board to be utilized in a hybrid integrated circuit, whereby the reliability with respect to a thick film resistor can be obtained. However, it is well known that in the thick films thus formed, the limit of a width of a fine pattern is 100 to 200 micrometers. Accordingly, in a well known method, thick film conductors are formed in a subtractive manner by etching or laser firing so that a fine pattern may be formed. However, in order to form a thick film conductor in a subtractive manner, it is necessary to form in advance a thick film conductor in a non-fired or fired state over the whole surface of a substrate. Particularly, in case of a substrate containing a resistor, it is difficult to form a second conductor in regions close to the resistor by a thick film printing, which makes it substantially impossible to form a fine pattern. In the case of a substrate on which resistors are formed, precious metal materials such as silver-palladium, platinum-silver and the like are generally used as a thick film conductor material, which involves a disadvantage that the conductor sheet resistance value is as high as 20 to 100 milliohms in a thick film conductor formed of such a thick film material, exerting unfavorable influence on the signal transmission system.

SUMMARY OF THE INVENTION

Briefly stated, the present invention is a method of manufacturing a multilayer circuit board, comprising the steps of: providing a substrate; forming the first conductor layer having a plurality of portions on a substrate with a predetermined pattern; forming a resistor to be connected between the specified portions of the first conductor layer, by forming and firing a thick film; forming an insulating layer of a resin over the first conductor layer and the resistor; forming the second conductor layer on the insulating layer by plating the insulating layer and etching the plated layer with a predetermined pattern. According to the present invention, the second conductor layer can be formed in a region close to the thick film resistor and the thick film resistor can be overlapped with the second conductor layer. The second conductor layer is formed by plating with a low resistance metal.

Therefore, a primary object of the present invention is to provide a method of manufacturing a multilayer circuit board, by which a high degree of integration and high reliability can be attained.

A principal advantage of the present invention is that by forming an insulating layer of a resin over a first conductor layer and a thick film resistor and by forming thereon a second conductor layer by plating, connection with a fine pattern can be obtained in a multilayer circuit board to be utilized in a hybrid integrated circuit.

Another advantage of the present invention is that no problem will be caused in the signal transmission system of a hybrid integrated circuit since a low resistance conductor layer is employed.

These objects and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
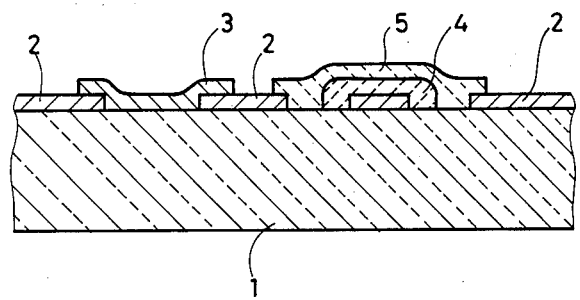
FIG. 1 is a sectional view of a multilayer circuit board manufactured by a conventional manufacturing method.
Figure 2:
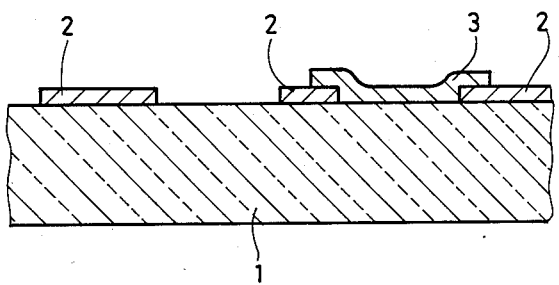
FIGS. 2 to 4 are sectional views of, according to the order of manufacturing steps, a multilayer circuit board manufactured by an embodiment of the present invention.
Figure 3:
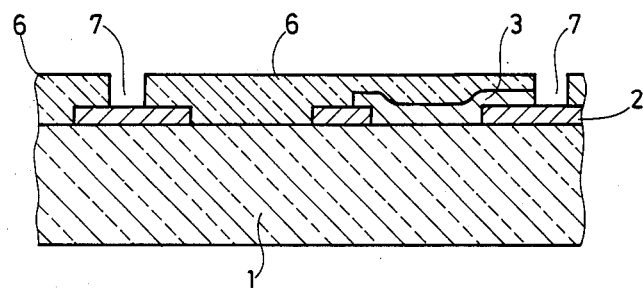
Figure 4:
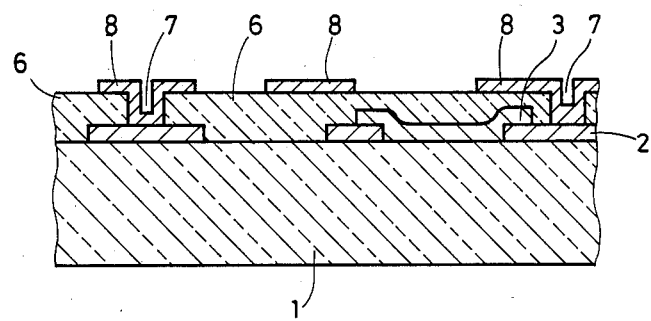

FIGS. 2 to 4 are sectional views showing according to the order of manufacturing steps, a multilayer circuit board formed by a manufacturing method of an embodiment of the present invention. In the following, a manufacturing process will be described successively with reference to the drawings.

First, referring to FIG. 2, a thick film of the first conductor layer 2 made of silver-palladium is provided on a substrate 1 made of alumina ceramic for example. The first conductor layer 2 is formed by firing a thick film paste of silver-palladium for example (the proportion of weight of Ag and Pd being 2.5:1) in a belt furnace for 45 minutes (the peak temperature is 850° C.).

Subsequently, a thick film resistor 3 is formed to be connected to the first conductor layer 2. This thick film resistor 3 is formed by firing a paste of ruthenium oxide ($RuO_2$) in a belt furnace for 45 minutes (the peak temperature is 800° C.).

Referring to FIG. 3, an insulating layer 6 of a polyimide resin is then formed over the substrate 1, the first conductor layer 2 and the thick film resistor 3. The insulating layer 6 includes through holes 7 on the first conductor layer 2. The insulating layer 6 and the through holes 7 are formed with a predetermined pattern by a process in which a photosensitive polyimide resin coated on the whole surface of the substrate 1 is subjected to exposure and development using a suitable mask and then is heated and hardened in nitrogen at 350° C. Subsequently, in order to deposit electroless plating on the substrate 1, an activation treatment is applied by coating the substrate 1 with CCP4200 of Okuno Pharmaceutical Industries Co., Ltd. for example.

Referring to FIG. 4, the second conductor layer 8 is formed on the insulating layer 6 and within the through holes 7. The second conductor layer 8 is formed according to the following process. First, the substrate 1 is soaked in an electroless plating bath so that nickel is deposited on the whole surface of the surface. At this time, nickel is also deposited on the wall surfaces of the through holes 7 formed in the polyimide resin insulating layer 6 and on the exposed portions of the first conductor layer 2, whereby electric connection between the first conductor layer 2 and the second conductor layer 8 can be made. Subsequently, copper of approximately 10 micrometers or the like is deposited on the electroless nickel by electroplating. Then, a resist layer (not shown) is formed using photolithography and etching is applied thereto so that the second conductor layer 8 is formed. In this case, a width of a fine pattern can be easily made as small as 30 micrometers.

In the above mentioned embodiment, a case of two conductor layers and a single insulating layer was described. However, by repeating the step of forming an insulating layer of a polyimide resin and the subsequent step of forming a conductor layer by plating and etching, the number of layers can be increased.

If the top conductor layer excluding the portions for attachment of components is coated with a resin, reliability of a hybrid integrated circuit can be further improved.

Although in the above mentioned embodiment, a photosensitive polyimide resin was used as a resin for forming an insulating layer, the same effect will be obtained by using other suitable resins, insofar as they can be formed into a desired pattern and satisfy the conditions, such as thermal resistance and chemical resistance.

As a metallic material for the first conductor layer, noble or bare metals such as platinum-gold or copper thick film paste, or carbon paste may be used instead of silver-palladium in the above described embodiment. As a metal for electroless plating, copper and the like may be used instead of nickel in the above described embodiment.

In addition, the thickness of the second conductor layer may be made larger by applying electroless plating of a larger deposition rate.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a multilayer circuit board comprising the steps of:
   providing a substrate,
   forming a plurality of portions of a first thick film conductor layer on said substrate with a predetermined pattern,
   forming a thick film resistor to be connected to the portions of said first conductor layer by forming and firing a thick film,
   forming an insulating layer of a photosensitive polyimide resin over said first conductor layer and said resistor,
   providing through holes in said insulating layer by applying patterning thereto with a mask so that said first conductor layer may be partially exposed,
   forming a second conductor layer on said insulating layer by applying plating onto said insulating layer and by etching said plated layer with a predetermined pattern,
   wherein said step of forming said second conductor layer further comprises the steps of:
   forming a first plating layer on the whole surface of said sbustrate by applying electroless plating, said first plating layer being in contact with portions of the first conductor layer,
   forming a second plating layer on the whole surface of said first plating layer by applying electroplating, and
   etching said first plated layer and said second plated layer with a predetermined pattern.

2. A method in accordance with claim 1, wherein said first plated layer is a nickel plated layer and said second plated layer is a copper plated layer.

3. A method in accordance with claim 1, wherein said substrate is made of alumina ceramic.

4. A method in accordance with claim 1, wherein said first conductor layer is made of silver-palladium or platinum-gold or copper thick film paste.

5. A method in accordance with claim 1, wherein said resistor is made of ruthenium oxide.

6. The method of claim 1, wherein said predetermined patterns are formed by photolithography.

7. The method of claim 1, wherein the width of the first and second conductor layers is about 30 micrometers.

* * * * *